United States Patent
Yu et al.

(10) Patent No.: US 8,542,773 B2
(45) Date of Patent: Sep. 24, 2013

(54) DIGITAL RF CONVERTER, DIGITAL RF MODULATOR AND TRANSMITTER INCLUDING THE SAME

(75) Inventors: Hyun Kyu Yu, Daejeon (KR); Jang Hong Choi, Daejeon (KR); Hyun Ho Boo, Daejeon (KR); Pil Jae Park, Daejeon (KR); Mun Yang Park, Daejeon (KR); Seong Do Kim, Daejeon (KR); Sun Bo Shim, Busan (KR); Song Cheol Hong, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 324 days.

(21) Appl. No.: 12/968,731

(22) Filed: Dec. 15, 2010

(65) Prior Publication Data

US 2011/0150125 A1 Jun. 23, 2011

(30) Foreign Application Priority Data

Dec. 18, 2009 (KR) .................. 10-2009-0127518
Mar. 29, 2010 (KR) .................. 10-2010-0027986

(51) Int. Cl.
*H04L 27/20* (2006.01)
*H03C 3/00* (2006.01)
*H03M 3/00* (2006.01)
*H03M 1/66* (2006.01)

(52) U.S. Cl.
USPC ............ 375/302; 375/295; 341/143; 341/144

(58) Field of Classification Search
USPC ................ 375/295, 302, 308; 341/126, 143, 341/144, 145; 455/91, 127.1
See application file for complete search history.

(56) References Cited

U.S. PATENT DOCUMENTS

| | | | |
|---|---|---|---|
| 5,760,726 A * | 6/1998 | Koifman et al. | 341/145 |
| 5,977,899 A * | 11/1999 | Adams | 341/145 |
| 6,005,506 A | 12/1999 | Bazarjani et al. | |
| 6,906,652 B2 * | 6/2005 | Bugeja | 341/145 |
| 6,937,848 B2 | 8/2005 | Eloranta et al. | |
| 7,421,037 B2 | 9/2008 | Shakeshaft et al. | |
| 7,424,064 B2 | 9/2008 | Shakeshaft et al. | |
| 2003/0067404 A1 | 4/2003 | Ruha et al. | |
| 2004/0081252 A1 * | 4/2004 | Hsu | 375/295 |
| 2004/0192229 A1 * | 9/2004 | Morris et al. | 455/91 |
| 2005/0111573 A1 | 5/2005 | Shakeshaft et al. | |
| 2005/0265481 A1 * | 12/2005 | Bellaouar et al. | 375/308 |
| 2010/0027711 A1 * | 2/2010 | Manku et al. | 375/295 |

FOREIGN PATENT DOCUMENTS

KR 10-2004-0037216 A 5/2004
KR 10-0712412 B1 4/2007

OTHER PUBLICATIONS

Petri Eloranta et al., "Direct-Digital RF Modulator IC in 0.13 μm CMOS for Wide-Band Multi-Radio Applications", ISSCC, 2005, pp. 532-533, 615, Session 29, IEEE.
Petri Eloranta et al., "A WCDMA Transmitter in 0.13 μm CMOS Using Direct-Digital RF Modulator" ISSCC, 2007, pp. 340-341, 607, Session 19, IEEE.
Petri Eloranta et al., "A Multimode Transmitter in 0.13 μm CMOS Using Direct-Digital RF Modulator", IEEE Journal of Solid-State Circuits, Dec. 2007, pp. 2774-2784, vol. 42, No. 12, IEEE.
Albert Jerng et al., "A Wideband ΔΣ Digital-RF Modulator for High Data Rate Transmitters", IEEE Journal of Solid-State Circuits, Aug. 2007, pp. 1710-1722, vol. 42, No. 8, IEEE.

* cited by examiner

*Primary Examiner* — Betsy Deppe

(57) ABSTRACT

A digital RF converter, a digital RF modulator, and a transmitter are provided. The digital RF converter includes a delta-sigma modulated bits (DSMB) sub-block that generates a current magnitude corresponding to least-significant n bits among input signals at a first sampling speed, a least-significant bit (LSB) sub-block that generates a current magnitude corresponding to intermediate k bits among the input signals at a second sampling speed lower than the first sampling speed, and a most-significant bit (MSB) sub block that generates a current magnitude corresponding to most-significant m bits among the inputs signals at the second sampling speed.

15 Claims, 8 Drawing Sheets

DIGITAL RF CONVERTER, DIGITAL RF MODULATOR AND TRANSMITTER INCLUDING THE SAME

CROSS-REFERENCE TO RELATED APPLICATIONS

This application claims the priorities of Korean Patent Application Nos. 10-2009-0127518 filed on Dec. 18, 2009 and 10-2010-0027986 filed on Mar. 29, 2010, in the Korean Intellectual Property Office, the disclosures of which are incorporated herein by reference.

BACKGROUND OF THE INVENTION

1. Field of the Invention

The present invention relates to a digital RF converter, and more particularly, to a digital RF converter capable of improving a dynamic range of a transmitter and a signal to noise ratio, a digital RF modulator and a transmitter including the same.

2. Description of the Related Art

In wireless communication applications, the design thereof has been continuously developed to have simple and inexpensive wireless architectural structures which can increase integration in mobile terminals.

FIG. 1 shows a general analog circuit based transmitter. Referring to FIG. 1, the transmitter circuit includes digital-to-analog converters (D/A) 11 and 12, low pass filters (LPF) 13 and 14, mixers 15 and 16, a band pass filter (BPF) 17, and a linear power amplifier (PA) 18.

The digital-to-analog converters 11 and 12 convert in-phase signals I and quadrature signals Q of a baseband, respectively, which are discrete signals having a plurality of data bits, into analog signals while the low pass filters 13 and 14 filter spurious waves occurring at a position separated by a multiple of a sampling frequency of a baseband in consideration of digital signal characteristics.

The mixers 15 and 16 perform frequency up conversion on low-passed signals based on carrier signals (cos ωLOt, sin ωLOt) generated from a frequency synthesizer and the band pass filter 17 serves to filter the spurious waves that are not completely removed by the low pass filter or the spurious waves and cosine signals that are generated due to the non-linearity of the mixers.

The linear power amplifier 18 amplifies the filtered signals to generate the RF signals and transmits them through a duplexer or a switch to an antenna.

However, the transmitter shown in FIG. 1 has the following problem. First, the entire performance of the transmitter system may be deteriorated due to non-ideal operations of analog circuits such as non-linearity, carrier feedthrough, and so on, of the mixer and the low pass filter included in the transmitter circuit. Second, a bandwidth of a signal to be transmitted is limited due to analog baseband circuits. Third, when making a circuit including all the functions, an area occupied on the semiconductor substrate is increased.

In order to solve the problems, Shakeshaft (US 2005/01115330 A1) introduced the concept of a current steering D/A converter. According to the concept, Shakeshaft configures a digital-to-RF converter having both the function of a digital-to-analog converter and the function of a frequency up conversion mixer by connecting a plurality of cells in a Gilbert-cell mixer type in parallel as shown in FIGS. 2 and 3 and controlling each of them with digital signals and applies the digital-to-RF converter to a transmitter circuit system as shown in FIG. 4.

In Shakeshaft's invention, the dynamic range of the transmitting end is limited according to the number of cells connected in parallel, that is, a data bit size of the digital control signals connected to each cell. The maximum voltage of the output signal in the dynamic range is limited by the magnitude of the supply voltage to the circuit and the minimum voltage thereof is limited by the unit cell having the smallest size, that is, the size of the least-significant bit cell in FIG. 2, wherein the size is determined by the size of the transistor having the smallest sized gate width manufactured during the semiconductor process.

As described above, since the dynamic range is limited according to the number of cells, the maximum signal-to-noise ratio (SNR) that can be obtained by the transmitter circuit is limited by the restrictions in the semiconductor process and the supply voltage to the circuit.

Further, if each cell is designed to have the same unit-weight, the entire linearity of the transmission system is getting better, but the number of cells is increased such that the semiconductor circuit layout design becomes complicated and the electrical coupling in the circuit becomes large to increase the signal interference and the design area. When the data bit size of the digital control signal is, for example, 8 bits, the total number of required cells is 256.

Shakeshaft's invention uses two kinds of cells having different sizes to configure least-significant bit (LSB) sub-blocks by connecting large cells having a small operating current in parallel and most-significant bit (MSB) sub-blocks by connecting large cells having a large operating current in parallel as shown in FIG. 2, thereby reducing the total number of cells required in the transmitter circuit. If it is assumed that the current of the cell having the large operating current is 8 times larger than the current of the cell having the small operating current, the number of LSB cells configuring the LSB sub-blocks is 7 and the number of MSB cells configuring the MSB sub-blocks is 31, thereby making it possible to obtain a signal to noise ratio similar to that of the performance of a transmitter circuit configured of only 255 LSB cells.

However, even when the structure according to Shakeshaft's invention requires the performance of a transmitter circuit configured of only 1023 LSB cells, it requires 7 LSB cells and 127 MSB cells.

SUMMARY OF THE INVENTION

An aspect of the present invention provides a digital RF converter using the existing digital RF converting cells, controlling baseband signals of each cell with digital signals, and applying sigma-delta modulated signals to a plurality of additional cells in order to generate current having a smaller magnitude than current generated by one cell having the smallest size, thereby making it possible to improve the entire dynamic range and a signal to noise ratio of a transmitter, and a digital RF modulator and a transmitter including the same.

According to an aspect of the present invention, there is provided a digital RF converter, including: a delta-sigma modulated bits (DSMB) sub-block that generates a current magnitude corresponding to least-significant n bits among input signals at a first sampling speed; a least-significant bit (LSB) sub-block that generates a current magnitude corresponding to intermediate k bits among the input signals at a second sampling speed lower than the first sampling speed; and a most-significant bit (MSB) sub block that generates a current magnitude corresponding to most-significant m bits among the inputs signals at the second sampling speed.

The least-significant n bits are signals that are sigma-delta modulated, oversampled, and noise-shaped and the first sampling speed is the same as the sigma-delta modulation speed.

The DSMB sub-block may include: $2^n-1$ cells that have a minimum current magnitude; and $2^n-1$ latches that provide the least-significant n bits to the $2^n-1$ cells at the first sampling speed to vary the amount of current flowing through the $2^n-1$ cells.

The LSB sub-block may include: k cells that have a current magnitude changed in a binary weight manner; and k latches that provide the intermediate k bits to the k cells at the second sampling speed.

The MSB sub-block may include: $2^m-1$ cells that change the signal value of the output signal in a current magnitude unit of $2^k I$ according to the most-significant m bits; and $2^m-1$ latches that provide the least significant most-significant m bits to the $2^m-1$ cells at the second sampling speed.

According to another aspect of the present invention, there is provided a digital RF modulator, including: a pulse shaping digital filter that receives digital signals of a baseband to pulse-shape only digital signals included in a communication bandwidth; a sigma-delta modulator that performs sigma-delta modulation on least-significant n bits among the pulse-shaped signals; a decoder that decodes the sigma-delta modulated n bits, the intermediate k bits among the pulse shaped signals, and the most-significant m bits among the pulse-shaped signals by a thermometer code or a binary code, respectively; and a digital RF converter that segments the decoded n bits, the decoded k bits, and the decoded m bits and performs digital-to-analog conversion thereon, performs the digital-to-analog conversion on the decoded n bits at the same sampling speed as the sigma-delta modulator, and performs the digital-to-analog conversion on the decoded k bits and m bits at the sampling speed lower than that of the sigma-delta modulator.

The digital RF converter may include: a delta-sigma modulated bits (DSMB) sub-block that generates a current magnitude corresponding to the decoded n bits at the same sampling speed as the sigma-delta modulator; a least-significant bit (LSB) sub-block that generates a current magnitude corresponding to the decoded k bits at the sampling speed lower than that of the sigma-delta modulator; and a most-significant bit (MSB) sub-block that generates a current magnitude corresponding to the decoded m bits at the sampling speed lower than that of the sigma-delta modulator.

The DSMB sub-block may include: $2^n-1$ cells that change the signal value of the output signal in a current magnitude unit of I according to the decoded n bits; and $2^n-1$ latches that provide the decoded n bits to the $2^n-1$ cells at the same sampling speed as the sigma-delta modulator.

The LSB sub-block may include: k cells that change the signal value of the output signal according to the decoded k bits in a binary weight manner; and k latches that provide the decoded k bits to the k cells at the sampling speed lower than that of the sigma-delta modulator.

The MSB sub-block may include: $2^m-1$ cells that change the signal value of the output signal in a current magnitude unit of $2^k I$ according to the decoded m bits and $2^m-1$ latches that provide the decoded m bits to the $2^m-1$ cells at the sampling speed lower than that of the sigma-delta modulator.

The digital RF modulator may further include a delay correction circuit that synchronizes the intermediate k bits among the pulse-shaped signals and the most-significant m bits among the pulse-shaped signals with the sigma-delta modulated n bits and inputs them to the decoder.

According to another aspect of the present invention, there is provided a direct up conversion transmitter, including: two digital RF modulators that modulate and output certain bits of in-phase signals and quadrature signals at different sampling speeds; a carrier signal generator that generates carrier signals required to modulate the in-phase signals and the quadrature signals; a differential-single output converter that converts the modulated in-phase signals and quadrature signals into a single output signal; a filter that removes cosine signals and spurious waves included in the single output signal; and a power amplifier that amplifies and outputs the power of the filtered signal.

Each of the two digital RF modulators may include: a pulse shaping digital filter that receives the in-phase signals or the quadrature signals to pulse-shape only the digital signals included in a communication bandwidth; a sigma-delta modulator that performs sigma-delta modulation on least-significant n bits among the pulse-shaped signals; a decoder that decodes the sigma-delta modulated n bits, the intermediate k bits among the pulse shaped signals, and the most-significant m bits among the pulse-shaped signals by a thermometer code or a binary code, respectively; and a digital RF converter that segments the decoded n bits, the decoded k bits, and the decoded m bits and performs digital-to-analog conversion thereon, performs the digital-to-analog conversion on the decoded n bits at the same sampling speed as the sigma-delta modulator, and performs the digital-to-analog conversion on the decoded k bits and m bits at the sampling speed lower than the sigma-delta modulator.

The digital RF converter may include: a delta-sigma modulated bits (DSMB) sub-block that generates a current magnitude corresponding to the decoded n bits at the same sampling speed as the sigma-delta modulator; a least-significant bit (LSB) sub-block that generates a current magnitude corresponding to the decoded k bits at the sampling speed lower than that of the sigma-delta modulator; and a most-significant bit (MSB) sub-block that generates a current magnitude corresponding to the decoded m bits at the sampling speed lower than that of the sigma-delta modulator.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
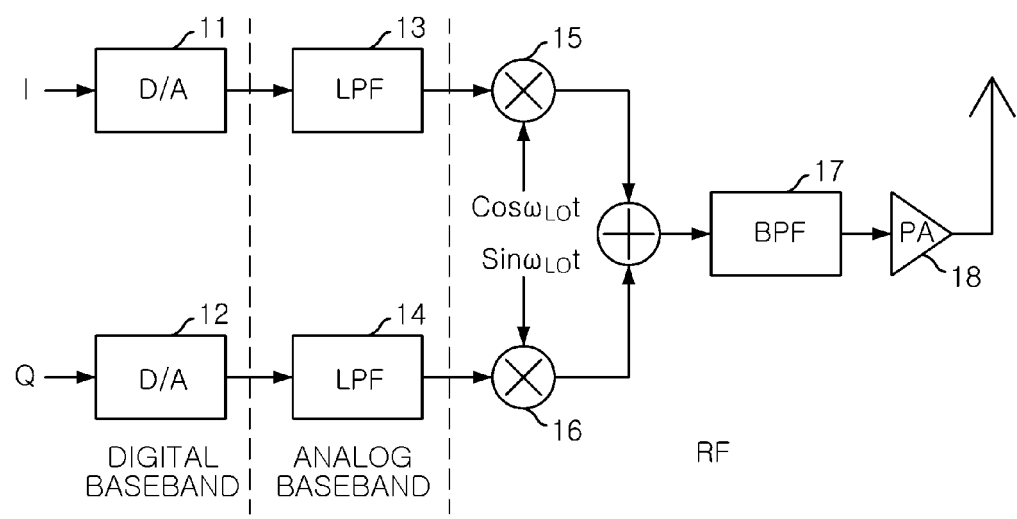
FIG. 1 is a diagram showing a typical analog circuit based transmitter.
Figure 2:
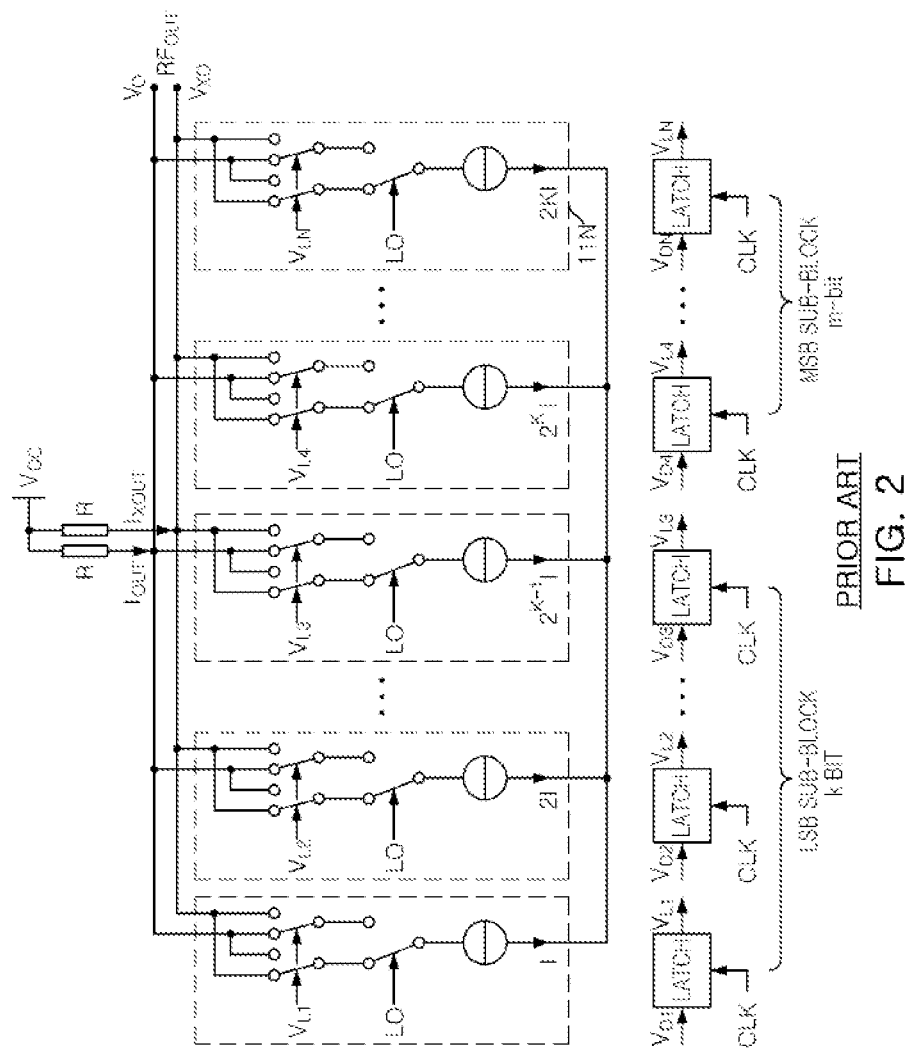
FIG. 2 is a diagram showing a configuration of a digital RF converter according to the related art.
Figure 3:
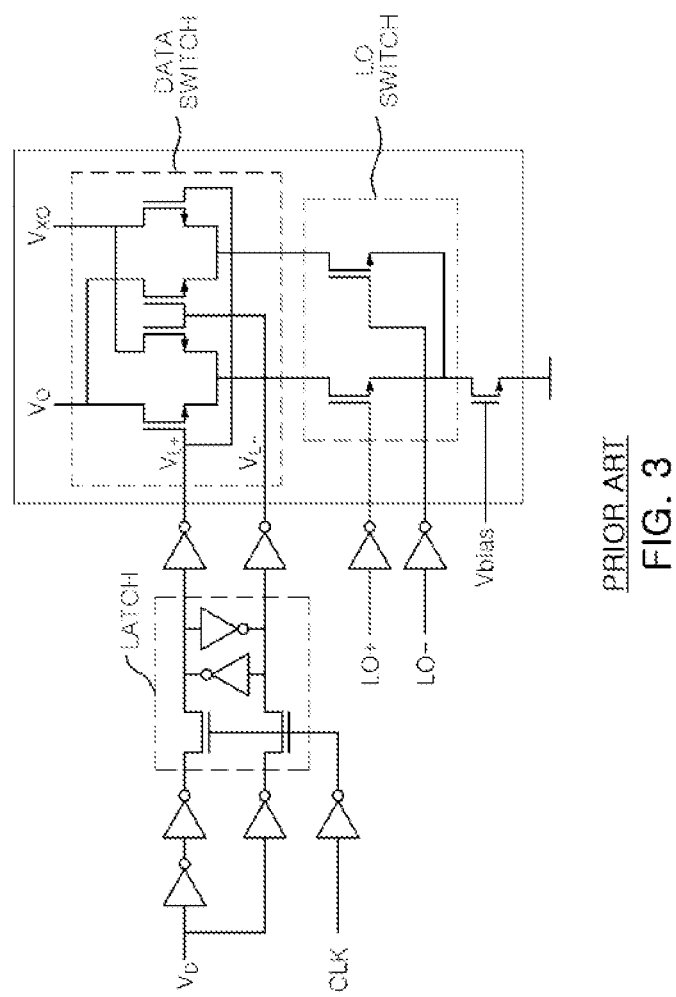
FIG. 3 is a diagram showing a detailed configuration of a cell included in the digital RF converter according to the related art.
Figure 4:
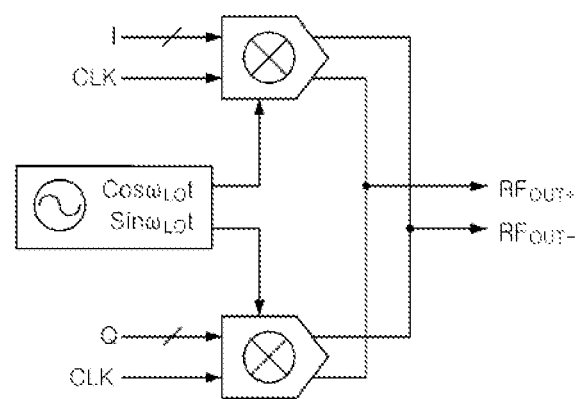
FIG. 4 is a functional diagram showing the digital RF converter according to the related art.

Although the present invention can be modified variously and have several embodiments, the exemplary embodiments are illustrated in the accompanying drawings and will be described in detail in the detailed description.

However, the present invention is not limited to the specific embodiments and should be construed as including all the changes, equivalents, and substitutions included in the spirit and scope of the present invention.

Further, terms used in the specification, 'first', 'second', etc. can be used to describe various components, but the components are not to be construed as being limited to the terms. The terms are only used to differentiate one component from other components. For example, the first component may be called the second component without departing from the scope of the present invention. Likewise, the second component may be called the first component. The term 'and/or' includes a combination of a plurality of items or any one of a plurality of terms.

In the case it is stated that any components are "connected" or "coupled" to other components, it is to be understood that the components may be directly connected or coupled to other components, but there is another component therebetween. On the other hand, in the case that it is stated that any components are "directly connected" or "directly coupled" to other components, it is to be understood that there is no another component therebetween.

The terms used in the specification are used to describe only specific embodiments and are not intended to limit the present invention. Singular forms are intended to include plural forms unless the context clearly indicates otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

Unless indicated otherwise, it is to be understood that all the terms used in the specification including technical and scientific terms has the same meaning as those that are understood by those who skilled in the art. It must be understood that the terms defined by the dictionary are identical with the meanings within the context of the related art, and they should not be ideally or excessively formally defined unless the context clearly dictates otherwise.

Hereinafter, exemplary embodiments of the present invention will be described in detail with reference to the accompanying drawings. In describing the present invention, like components are denoted by like reference numerals in order to help in an overall understanding of the present invention and descriptions of the same or like components will not be repeated.

Figure 5:
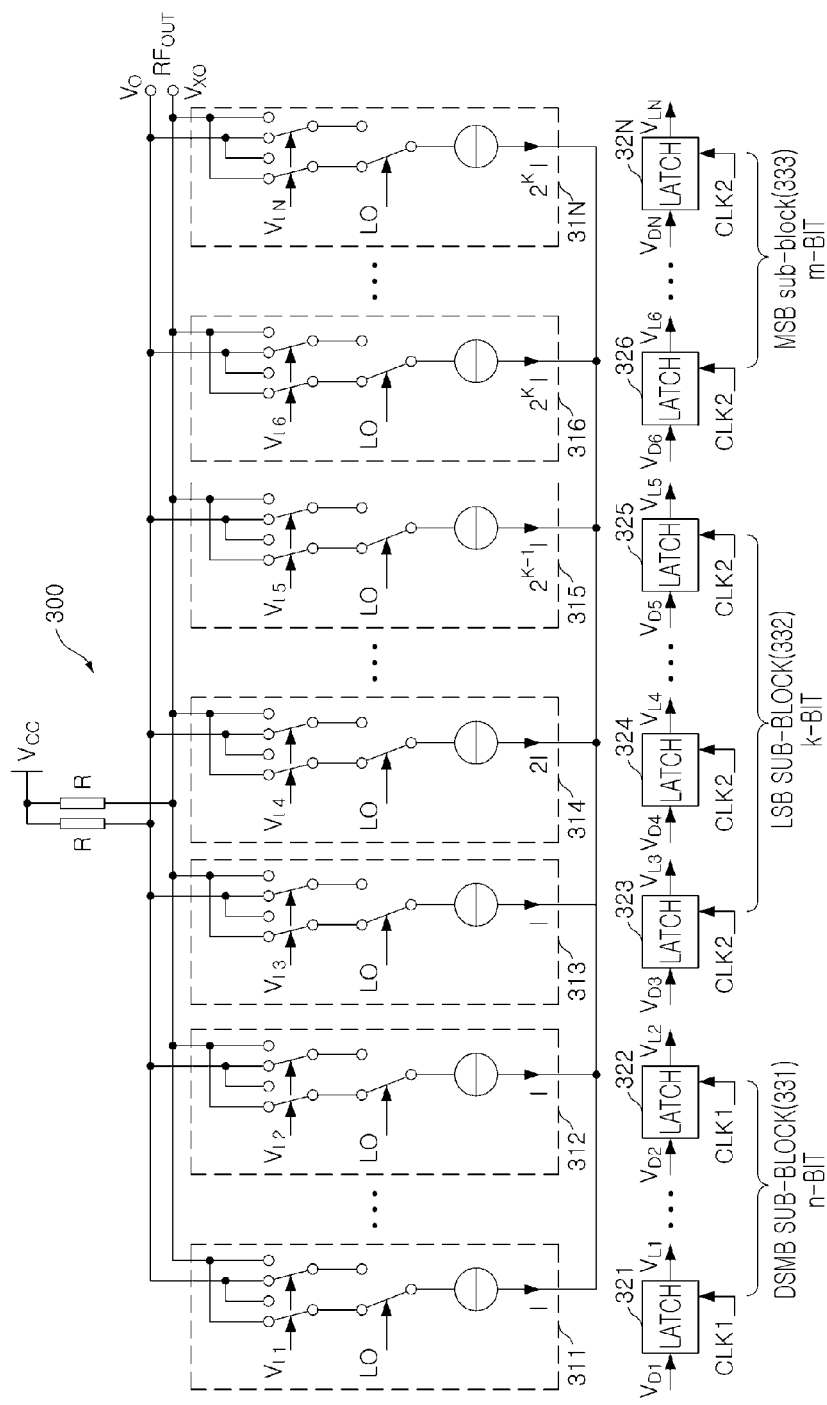
FIG. 5 is a diagram showing a configuration of a digital RF converter according to an exemplary embodiment of the present invention.

FIG. 5 is a diagram showing a configuration of a digital RF converter according to an exemplary embodiment of the present invention.

Referring to FIG. 5, the digital RF converter 300 includes a plurality of cells 311 to 31N connected in parallel and a plurality of latches 321 to 32N and divides the latches into a delta-sigma modulated bits (DSMB) sub-block 331, a least-significant bit (LSB) sub-block 332, and a most-significant bit (MSB) sub-block 333.

If it is assumed that the digital signal from the baseband is divided into n bits, k bits, and m bits in order from the least-significant bit, the least-significant n bits are oversampled and noise-shaped by the sigma-delta modulator (not shown) and are then applied to the DSMB sub-block 331 and the intermediate k bits and the most-significant m bits are applied to the LSB sub-block 332 and the MSB sub-block 333 as they are, without being subjected to separate modulation.

The DSMB sub-block 331 is driven at a sampling frequency faster than those of the LSB sub-block 332 and the MSB sub-block 333. That is, the DSMB sub-block 331 is synchronized with a first clock CLK1 having the same oversampled frequency as the sigma-delta modulator to perform the digital-to-analog conversion but the LSB and MSB sub-blocks 332 and 333 are synchronized with the second clock CLK2 having the existing sampling frequency (that is, the sampling frequency lower than that of the first clock CLK1) to perform the digital-to-analog conversion.

To this end, the DSMB sub-block 331 includes $2^n-1$ latches 321 and 322 that vary the current amount flowing through $2^n-1$ cells 311 and 312 by providing the least-significant n bits VL1 and VL2, which are synchronized with the $2^n-1$ cells 311 and 312 having a minimum current magnitude I and the first clock CLK1, to the $2^n-1$ cells 311 and 312. The LSB sub-block 332 includes k latches 323 to 325 that vary the amount of current flowing through k cells 313 to 315 by providing the intermediate k bits VL3, VL4, and VL5, which are synchronized with the k cells 313 to 315 having a current magnitude changed in a binary weight manner and a second clock CLK2, to the k cells 313 to 315, and the MSB sub-block 333 includes $2^m-1$ latches 326 to 32N that vary the amount of current flowing through $2^m-1$ cells 316 to 31N by providing the most-significant m bits VL6 to VLN, which are synchronized with the $2^m-1$ cells 316 and 31N having a current magnitude of $2^k I$ (where k represents the number of cells included in the LSB sub-block and I represents the minimum current magnitude) and the second clock CLK2, to the $2^m-1$ cells 316 to 31N.

As a result, the digital RF converter 300 generates the current magnitude corresponding to the least-significant n bits that are oversampled and noise-shaped by the DSMB sub-block 331, the current magnitude corresponding to the intermediate k bits by the LSB sub-block 332, and the current magnitude corresponding to the most-significant m bit by the MSB sub-block 333, respectively.

However, since the DSMB sub-block 331 is driven at the sampling frequency faster than those of the LSB and MSB sub-blocks 332 and 333 as described above, it can generate the current magnitude smaller than the minimum current magnitude I of the cells included in the digital RF converter 300. The reason is that when the DSMB sub-block 331 is oversampled, the current magnitude generated by the DSMB sub-block 331 is averaged and the averaged current magnitude may be smaller than the minimum current magnitude I of the cells included in the digital RF converter 300.

As a result, the digital RF converter 300 can finely control and output a signal value of an output signal RFout according to the current magnitude generated by the DSMB sub-block 331.

As described above, the digital RF converter 300 of the present invention further includes the DSMB sub-block 331 capable of generating the current magnitude smaller than the minimum current magnitude I of the cells included in the digital RF converter 300, such that it can finely control the signals value of the output signal RFout, thereby making it possible to improve the dynamic range and the signal to noise ratio of the transmitter to which the digital RF converter 300 is applied.

Figure 6:
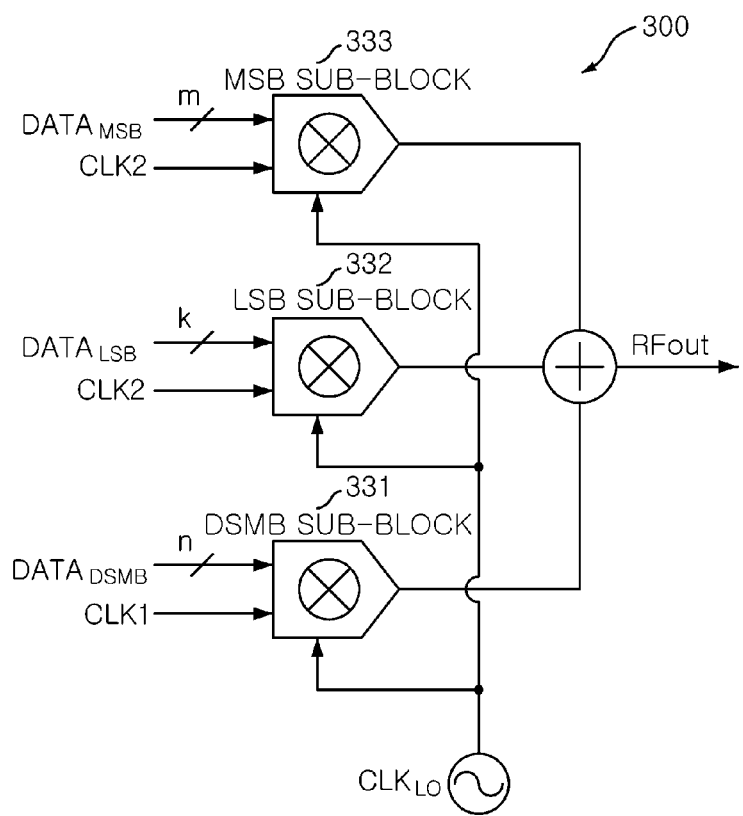
FIG. 6 is a functional diagram of the digital RF converter according to an exemplary embodiment of the present invention.

FIG. 6 is a functional diagram of the digital RF converter according to an exemplary embodiment of the present invention. Referring to FIG. 6, it can be appreciated that the digital RF converter is functionally divided into the DSMB sub-block 331, the LSB sub-block 332, and the MSB sub-block 333 and the DSMB sub-block 331 is driven by being synchronized with the first clock CLK1 having a frequency higher than that of the second clock CLK2 of the remaining two sub-blocks 332 and 333.

For reference, a method that increases the number of cells configuring the MSB sub-block has been used to expand the dynamic range and the signal to noise ratio of the transmitter; however, the method has problems in that the layout design becomes complicated and the entire linearity of the transmitter is degraded as the number of cells configuring the MSB sub-block is increased. Therefore, the present invention is to effectively improve the dynamic range and the signal to noise ratio of the transmitter without largely increasing the total number of cells by adding the DSMB sub-block that is configured and operated as described above.

Figure 7:
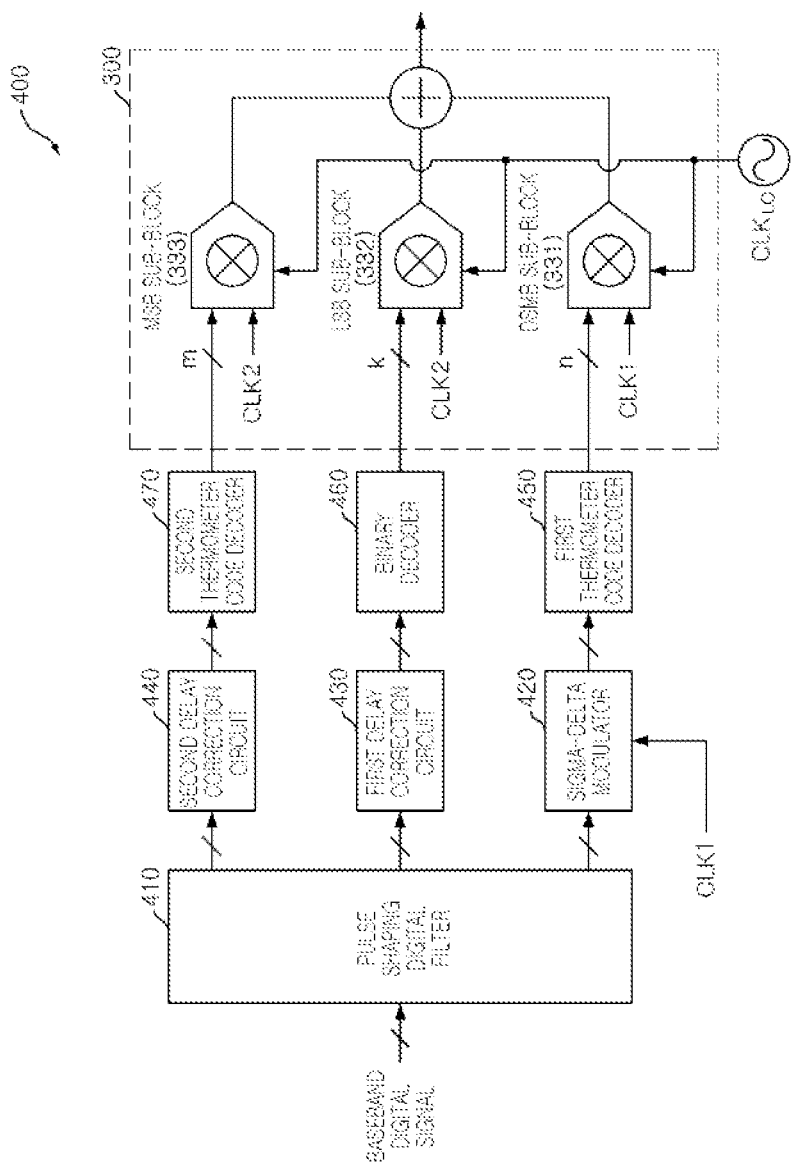
FIG. 7 is a diagram showing a digital RF modulator including the digital RF converter according to an exemplary embodiment of the present invention.

FIG. 7 is a diagram showing a digital RF modulator including the digital RF converter according to an exemplary embodiment of the present invention.

As shown in FIG. 7, the digital RF modulator includes a pulse shaping digital filter 410, a sigma-delta modulator 420, first and second delay correction circuits 430 and 440, first and second thermometer code decoder 450 and 470, a binary decoder 460, and the digital converter 300 that is configured and operated as shown in FIG. 5, or the like.

The pulse shaping digital filter 410 receives the digital signals of the baseband to remove the unnecessary digital signals appearing at a position corresponding to the multiple of the carrier frequency and selects only the digital signals included in the communication bandwidth to shape the pulse.

In this case, the digital signals output from the pulse shaping digital filter 410 may be divided into n bits, k bits, and m bits in order from the least-significant bits. In this case, the least-significant n bits are transmitted to the sigma-delta modulator 420, the intermediate k bits are transmitted to the first delay correction circuit 430, and the most-significant m bits are transmitted to the second delay correction circuit 440.

The sigma-delta modulator 420 modulates the least-significant n bits according the sigma-delta modulation scheme and outputs the oversampled and noise-shaped n bits. In this configuration, even though a signal input to the sigma-delta modulator 420 has a small data bit width, the sigma-delta modulator 420 is synchronized with the first clock CLK1 of the DSMB sub-block 331 to perform the oversampling, such that the output signal has improved resolution.

The first and second delay correction circuits 430 and 440 have the same delay component as the sigma-delta modulator 420 to delay the intermediate k bits and the most-significant m bits, such that the k bits and the m bits are synchronized and output with the output signal of the sigma-delta modulator 420. In other words, the intermediate k bits and the most-significant m bits are synchronized with the least-significant n bits and are then transmitted to a next stage.

The first thermometer code decoder 450 decodes the least-significant n bits transmitted through the sigma-delta modulator 420 to generate the thermometer code, and the binary decoder 460 decodes the intermediate k bits transmitted through the first delay correction circuit 430 to generate the binary code, and the second thermometer code decoder 470 decodes the most-significant m bits transmitted through the second delay correction circuit 440 to generate the thermometer code.

The digital RF converter 300 performs n+k+m segmentation on the digital signals output from the pulse shaping digital filter 310 and converts them, by the DSMB sub-block 331, the LSB sub-block 332, and the MSB sub-block 333.

The operation of the digital RF modulator of FIG. 7 will now be described.

First, the digital signals of the baseband input to the digital RF modulator 400 are converted into the pulse shaped signals to match the communication bandwidth by the pulse shaping digital filter 410, divided into the n bits, the k bits, and the m bits, and then input to the sigma-delta modulator 420 and the first and second delay correction circuits 430 and 440.

Thereafter, the least-significant n bits are changed into signals having relatively small bits by the sigma-delta modulator 420 and then input to the DSMB sub-block 331 of the digital RF converter 300 by the first thermometer code decoder 450.

At the same time, the intermediate k bits and the most-significant m bits are corrected by the delayed time generated when the least-significant n bits passes through the sigma-delta modulator 420 by the first and second delay correction circuits 430 and 440 and then input to the LSB sub-block 332 and the MSB sub-block 333 of the digital RF converter 300, respectively, through the binary decoder 460 and the second thermometer code decoder 470.

Then, the n bits, the k bits, and the m bits are segmented by the DSMB sub-block 331, the LSB sub-block 332, and the MSB sub-block 333 of the digital RF converter 300, subjected to the digital-to-analog conversion, and then summed, which are finally output in a form of one analog signal RFout.

Figure 8:
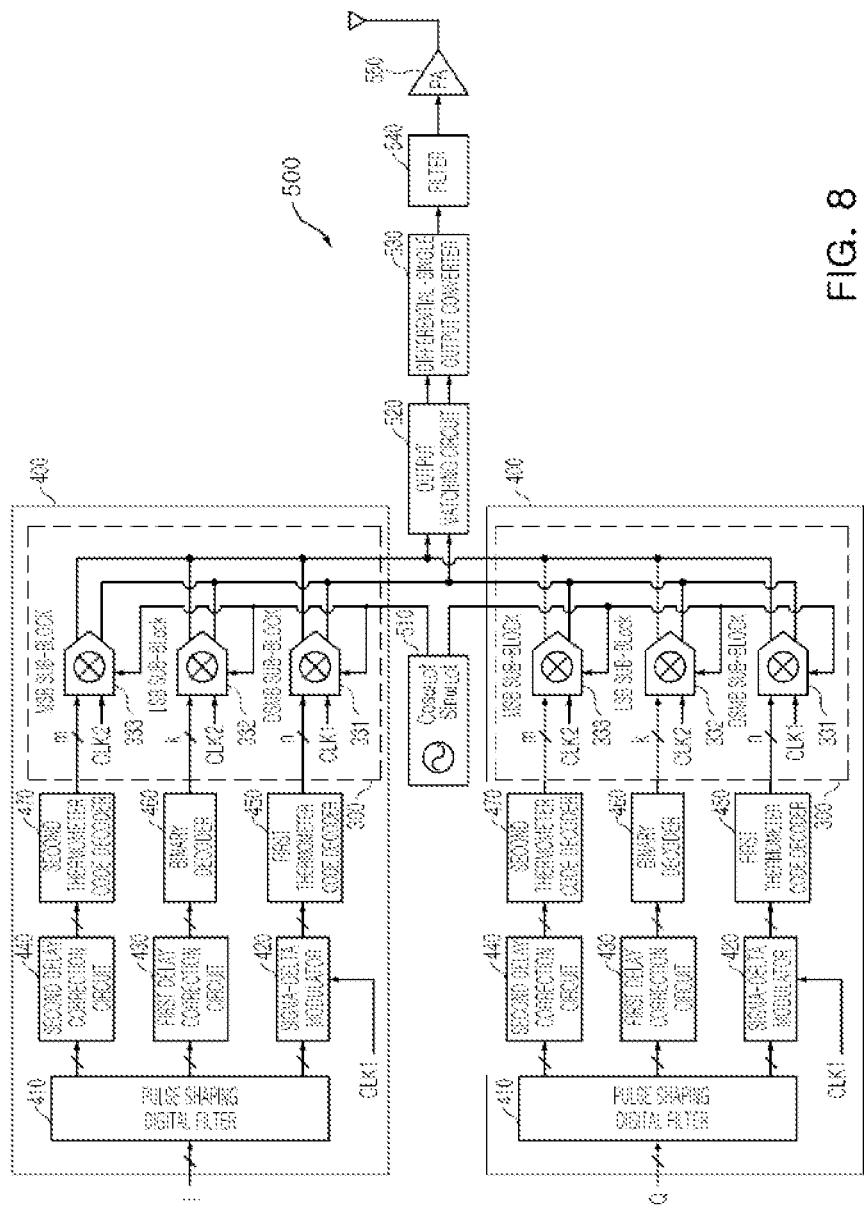
FIG. 8 is a diagram showing a direct up conversion transmitter including the digital RF modulator according to an exemplary embodiment of the present invention.

FIG. 8 is a diagram showing a direct up conversion transmitter including the digital RF converter according to an exemplary embodiment of the present invention.

Referring to FIG. 8, the direct up conversion transmitter 500 is configured and operated as shown in FIG. 7. The direction up conversion transmitter 500 includes two digital RF modulators 400 that convert and output certain bits (that is, the least-significant n bits) input in the digital signal form among the in-phase signals I and the quadrature signals Q into the digital-to analog at the sampling speed different from the remaining bits (that is, the intermediate k bits and m bits), a carrier signal generator (or frequency synthesizer) 510 that generates the carrier signals required to modulate the in-phase signals I and the quadrature signals Q, an output matching circuit 520 that matches the impedance of two analog signals output from two digital RF modulators 400 to 50Q, a differential-single output converter (or balun) 530 that converts two analog signals transmitted through the output matching circuit 520 into the single output signal, a filter 540 that removes the cosine signals and the spurious waves included in the single output signal, and a power amplifier (PA) 550 that amplifies the power of signals filtered by the filter 540, or the like.

The in-phase signals I and the quadrature signals Q, which are transmitted in the baseband input to the direct up conversion transmitter 500 of FIG. 8, are converted into differential signal pairs in analog form by two digital RF modulators 400 and then, the impedance of the in-phase signals I and the quadrature signals Q are matched with each other by the output matching circuit 520.

The impedance matched differential signal pairs are converted into the single output signal by the differential-single output converter or the balun 530 and are subjected to band pass filtering by the filter 540, such that the cosine signals and the spurious waves of the differential signal pairs are removed. Thereafter, the power is amplified by the PA 550.

The signals whose power is amplified are transmitted through the duplexer or the switch and the antenna in wireless.

As set forth above, the digital RF converter, the digital RF modulator and the transmitter including the same according to the present invention can effectively improve the dynamic range and signal to noise ratio of the transmitter even though the number of digital RF converting cells is not largely increased as compared to the related art.

Further, the present invention can prevent the deterioration in the system performance due to external conditions such as the supply voltage, the semiconductor process, the ambient temperature, or the like, by increasing the use of the digital circuit while minimizing the use of the analog circuit and can minimize power consumption required to operate the system with the increased use of the digital circuit. In addition, the present invention can reduce the area on the semiconductor chip occupied by the circuits.

While the present invention has been shown and described in connection with the exemplary embodiments, it will be apparent to those skilled in the art that modifications and variations can be made without departing from the spirit and scope of the invention as defined by the appended claims.

What is claimed is:

1. A digital RF converter, comprising:
a delta-sigma modulated bits (DSMB) sub-block configured to generate a current magnitude corresponding to least-significant n bits among input signals at a first sampling frequency;
a least-significant bit (LSB) sub-block configured to generate a current magnitude corresponding to intermediate k bits among the input signals at a second sampling frequency lower than the first sampling frequency; and
a most-significant bit (MSB) sub-block configured to generate a current magnitude corresponding to most-significant m bits among the inputs signals at the second sampling frequency.

2. The digital RF converter of claim 1, wherein the least-significant n bits are signals that are sigma-delta modulated, oversampled, and noise-shaped.

3. The digital RF converter of claim 2, wherein the first sampling frequency is substantially the same as a sigma-delta modulation frequency.

4. The digital RF converter of claim 1, wherein the DSMB sub-block includes:
$2^n-1$ cells having a minimum current magnitude; and
$2^n-1$ latches configured to provide the least-significant n bits to the $2^n-1$ cells at the first sampling frequency to vary an amount of current flowing through the $2^n-1$ cells.

5. The digital RF converter of claim 4, wherein the LSB sub-block includes:
k cells having a current magnitude of $2^{k-1}I$ (where k is a natural number, k represents the number of cells included in the LSB sub-block, and I represents the minimum current magnitude); and
k latches configured to provide the intermediate k bits to the k cells at the second sampling frequency to vary an amount of current flowing through the k cells.

6. The digital RF converter of claim 4, wherein the MSB sub-block includes:
$2^m-1$ cells having a current magnitude of $2^k I$ (where k represents the number of cells included in the LSB sub-block and I represents the minimum current magnitude); and
$2^m-1$ latches configured to provide the most-significant m bits to the $2^m-1$ cells at the second sampling frequency to vary an amount of current flowing through the $2^m-1$ cells.

7. A digital RF modulator, comprising:
a pulse shaping digital filter configured to receive digital signals of a baseband and pulse-shape only digital signals included in a communication bandwidth;
a sigma-delta modulator configured to perform sigma-delta modulation on least-significant n bits among the pulse-shaped signals;
a decoder configured to decode the sigma-delta modulated n bits to a thermometer code, decode the intermediate k bits among the pulse shaped signals to a binary code, and decode the most-significant m bits among the pulse-shaped signals to a thermometer code; and
a digital RF converter configured to segment the decoded n bits, the decoded k bits, and the decoded m bits and perform digital-to-analog conversion thereon, perform the digital-to-analog conversion on the decoded n bits at the same sampling frequency as that of the sigma-delta modulator, and perform the digital-to-analog conversion on the decoded k bits and m bits at a sampling frequency lower than that of the sigma-delta modulator.

8. The digital RF modulator of claim 7, wherein the digital RF converter includes:
a delta-sigma modulated bits (DSMB) sub-block configured to generate a current magnitude corresponding to the decoded n bits at the same sampling frequency as that of the sigma-delta modulator;
a least-significant bit (LSB) sub-block configured to generate a current magnitude corresponding to the decoded k bits at a sampling frequency lower than that of the sigma-delta modulator; and
a most-significant bit (MSB) sub-block configured to generate a current magnitude corresponding to the decoded m bits at a sampling frequency lower than that of the sigma-delta modulator.

9. The digital RF modulator of claim 8, wherein the DSMB sub-block includes:
$2^n-1$ cells having a minimum current magnitude; and
$2^n-1$ latches configured to provide the decoded n bits to the $2^n-1$ cells at the same sampling frequency as that of the sigma-delta modulator to vary an amount of current flowing through the $2^n-1$ cells.

10. The digital RF modulator of claim 9, wherein the LSB sub-block includes:
k cells having a current magnitude of $2^{k-1}I$ (where k is a natural number, k represents the number of cells included in the LSB sub-block, and I represents the minimum current magnitude); and
k latches configured to provide the decoded k bits to the k cells at a sampling frequency lower than that of the sigma-delta modulator to vary an amount of current flowing through the k cells.

11. The digital RF modulator of claim 9, wherein the MSB sub-block includes:
$2^m-1$ cells having a current magnitude of $2^k I$ (where k represents the number of cells included in the LSB sub-block and I represents the minimum current magnitude); and
$2^m-1$ latches configured to provide the decoded m bits to the $2^m-1$ cells at the sampling frequency lower than that of the sigma-delta modulator to vary an amount of current flowing through the $2^m-1$ cells.

12. The digital RF modulator of claim 7, further comprising a delay correction circuit configured to synchronize the intermediate k bits among the pulse-shaped signals and the most-significant m bits among the pulse-shaped signals with the sigma-delta modulated n bits, and input the synchronized k bits and m bits to the decoder.

13. A direct up conversion transmitter, comprising:
- a first digital RF modulator configured to modulate and output certain bits of in-phase signals at a different sampling frequency than remaining bits of the in-phase signals;
- a second digital RF modulator configured to modulate and output certain bits of quadrature signals at a different sampling frequency than remaining bits of the quadrature signals;
- a carrier signal generator configured to generate carrier signals required to modulate the in-phase signals and the quadrature signals;
- a differential-single output converter configured to convert the modulated in-phase signals and quadrature signals into a single output signal;
- a filter configured to remove cosine signals and spurious waves included in the single output signal; and
- a power amplifier configured to amplify and output the power of the filtered signal.

14. The direct up conversion transmitter of claim 13, wherein each of the first and second digital RF modulators includes:
- a pulse shaping digital filter configured to receive the in-phase signals or the quadrature signals and pulse-shape only the digital signals included in a communication bandwidth;
- a sigma-delta modulator configured to perform sigma-delta modulation on least-significant n bits among the pulse-shaped signals;
- a decoder configured to decode the sigma-delta modulated n bits to a thermometer code, decode the intermediate k bits among the pulse shaped signals to a binary code, and decode the most-significant m bits among the pulse-shaped signals to a thermometer code; and
- a digital RF converter configured to segment the decoded n bits, the decoded k bits, and the decoded m bits and perform digital-to-analog conversion thereon, perform the digital-to-analog conversion on the decoded n bits at the same sampling frequency as that of the sigma-delta modulator, and perform the digital-to-analog conversion on the decoded k bits and m bits at the sampling frequency lower than that of the sigma-delta modulator.

15. The direct up conversion transmitter of claim 14, wherein the digital RF converter includes:
- a delta-sigma modulated bits (DSMB) sub-block configured to generate a current magnitude corresponding to the decoded n bits at the same sampling frequency as that of the sigma-delta modulator;
- a least-significant bit (LSB) sub-block configured to generate a current magnitude corresponding to the decoded k bits at the sampling frequency lower than that of the sigma-delta modulator; and
- a most-significant bit (MSB) sub-block configured to generate a current magnitude corresponding to the decoded m bits at the sampling frequency lower than that of the sigma-delta modulator.

* * * * *